US008243511B2

(12) United States Patent
Patapoutian et al.

(10) Patent No.: US 8,243,511 B2
(45) Date of Patent: Aug. 14, 2012

(54) REUSE OF INFORMATION FROM MEMORY READ OPERATIONS

(75) Inventors: Ara Patapoutian, Hopkinton, MA (US); Bernardo Rub, Sudbury, MA (US); Bruce D. Buch, Westborough, MA (US)

(73) Assignee: Seagate Technology LLC, Scotts Valley, CA (US)

( * ) Notice: Subject to any disclaimer, the term of this patent is extended or adjusted under 35 U.S.C. 154(b) by 118 days.

(21) Appl. No.: 12/891,475

(22) Filed: Sep. 27, 2010

(65) Prior Publication Data

US 2012/0075930 A1 Mar. 29, 2012

(51) Int. Cl.
*G11C 16/08* (2006.01)
*G11C 16/28* (2006.01)

(52) U.S. Cl. ......... 365/185.02; 365/185.03; 365/185.09; 365/185.2; 714/773; 714/763

(58) Field of Classification Search ............... 365/185.2, 365/185.23, 185.02, 185.03, 185.09; 714/773, 714/763
See application file for complete search history.

(56) References Cited

U.S. PATENT DOCUMENTS

| 7,023,735 | B2 | 4/2006 | Ban et al. |
| 7,518,913 | B2 | 4/2009 | Wang et al. |
| 7,558,109 | B2 | 7/2009 | Brandman et al. |
| 7,751,237 | B2 | 7/2010 | Alrod et al. |
| 7,843,736 | B2 * | 11/2010 | Kang et al. ............... 365/185.18 |
| 2005/0013165 | A1 | 1/2005 | Ban |
| 2006/0028875 | A1 | 2/2006 | Avraham et al. |
| 2007/0086239 | A1 | 4/2007 | Litsyn et al. |
| 2007/0234183 | A1 * | 10/2007 | Hwang et al. ................ 714/763 |
| 2007/0283227 | A1 | 12/2007 | Sharon et al. |
| 2008/0270730 | A1 | 10/2008 | Lasser et al. |
| 2009/0282319 | A1 | 11/2009 | No et al. |
| 2009/0319868 | A1 | 12/2009 | Sharon et al. |
| 2010/0020604 | A1 | 1/2010 | Cornwell et al. |
| 2010/0088575 | A1 | 4/2010 | Sharon et al. |
| 2010/0091535 | A1 | 4/2010 | Sommer et al. |
| 2010/0118608 | A1 | 5/2010 | Song et al. |
| 2010/0131697 | A1 | 5/2010 | Alrod et al. |
| 2012/0079355 | A1 * | 3/2012 | Patapoutian et al. ......... 714/780 |

FOREIGN PATENT DOCUMENTS

| WO | WO2007132453 | 11/2007 |
| WO | WO2007132457 | 11/2007 |
| WO | WO2008026203 | 3/2008 |
| WO | WO2008053472 | 5/2008 |

OTHER PUBLICATIONS

Lee et al., "Drain Read Disturb Assessment of NOR Flash Memory", IEEE, 2008, 2 pages.

* cited by examiner

*Primary Examiner* — Andrew Q Tran
(74) *Attorney, Agent, or Firm* — Hollingsworth Davis, LLC

(57) ABSTRACT

A nominal reference read operation compares analog voltages of the memory cells to at least one nominal reference voltage. A shifted reference read operation compares the analog voltages of the memory cells to at least one shifted reference voltage that is shifted from the nominal reference voltage to compensate for an expected change in the analog voltages of the memory cells. Data stored in the memory cells is decoded by a first decoding process that uses the information from either the nominal reference read operation or the shifted reference read operation. The data stored in the memory cells is decoded by a second decoding process that uses the information from both the nominal reference read operation and the shifted reference read operation.

20 Claims, 11 Drawing Sheets

REUSE OF INFORMATION FROM MEMORY READ OPERATIONS

SUMMARY

Various embodiments described in this disclosure are generally directed to systems and methods for reusing information from memory read operations in decoding data stored in memory cells of a memory device. According to some embodiments, information is received from a nominal reference read operation of the memory cells indicative of data stored in the memory cells. The nominal reference read operation compares analog voltages of the memory cells to at least one nominal reference voltage. Information is received from a shifted reference read operation of the memory cells indicative of the data stored in the memory cells, the shifted reference read operation compares the analog voltages of the memory cells to at least one shifted reference voltage that is shifted from the nominal reference voltage to compensate for an expected change in the analog voltages of the memory cells. The data stored in the memory cells is decoded by a first decoding process that uses the information from either the nominal reference read operation or the shifted reference read operation. The data stored in the memory cells is decoded by a second decoding process that uses the information from both the nominal reference read operation and the shifted reference read operation. An output of the decoded data is generated by one or both of the first decoding process and the second decoding process.

In some implementations, the nominal reference read information is used to determine soft information for the second decoding process, and in some implementations, the shifted reference read information is used to determine soft information for the second decoding process. For example, one or both of the first and second decoding processes may include a low density parity check (LDPC) decoding process.

The shifted reference voltage may be shifted from the nominal reference voltage in a direction that compensates for an expected change in the analog voltages of the memory cells due to charge leakage and/or in a direction that compensates for an expected change in the analog voltages of the memory cells due to one or more of program disturb, read disturb and erase disturb. The shift in the shifted reference voltage may be determined according to a function of retention time of the data stored in the memory cells and/or according a model of the charge loss of the memory cells.

One of the first and second decoding processes may perform hard decision decoding and another of the first and second decoding processes may perform soft decision decoding. For example, in some implementations, the first decoding process performs hard decision decoding and the second decoding process performs soft decision decoding. Failure of the first decoding process to achieve convergence may trigger a request for either the nominal reference read operation or the shifted reference read operation. The second decoding process may be terminated in response to the first decoding process achieving convergence.

In some implementations, the nominal reference read operation is performed before the shifted reference read operation and the information from the nominal reference read operation is used in the first decoding process which is a hard decision decoding process.

In some implementations, the shifted reference read operation is performed before the nominal reference read operation and the information from the shifted reference read operation is used in the first decoding process which is a hard decoding process.

Some embodiments involve a memory device that includes input circuitry configured to receive information from a nominal reference read operation of memory cells. The nominal reference read operation compares analog voltages of the memory cells to at least one nominal reference voltage. The input circuitry is also configured to receive information from a shifted reference read operation of the memory cells. The shifted reference read operation compares the analog voltages of the memory cells to at least one shifted reference voltage that is shifted from the nominal reference voltage to compensate for an expected change in the analog voltages of the memory cells. The memory device also includes decoder circuitry configured to decode the data stored in the memory cells. The decoder circuitry implements a first decoding process that operates on either the information obtained from the nominal reference read operation or the information obtained from the shifted reference read operation. The decoder circuitry implements a second decoding process that operates on both the information obtained from the nominal reference read operation and the information obtained form the shifted reference read operation.

According to some aspects, the memory cells are multi level memory cells and the nominal reference voltage comprises a set of nominal reference voltages corresponding to multiple levels of the memory cells and the shifted reference voltage comprises a set of shifted reference voltages corresponding to the multiple levels of the memory cells.

The memory device may also include reference control circuitry that is configured to determine the shifted reference voltage. The shifted reference voltage may compensate for an expected change in the analog voltages of the memory cells due to one or both of charge leakage and disturb effects.

According to some implementations, the memory device also includes control circuitry configured to generate a request signal indicating a request for the nominal reference read operation or the shifted reference read operation. For example, the first decoding process may involve hard decision decoding and the control circuitry is configured to generate the request signal if the hard decision decoding process does not achieve convergence.

These and other features can be understood in view of the following detailed discussion and the accompanying drawings.

DETAILED DESCRIPTION

Figure 1A:
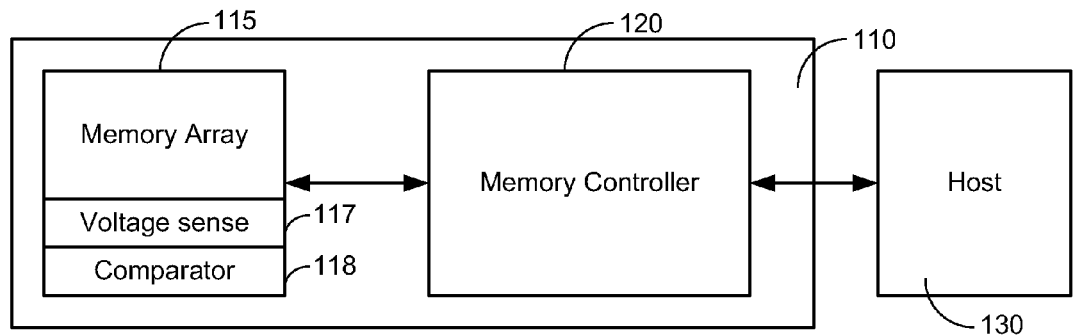
FIG. 1A is a block diagram illustrating a memory system capable of implementing reuse of information from memory read operations.

Some types of solid state memory cells are capable of storing data as an analog voltage. For example, flash memory includes an array of floating gate transistor memory cells, where the floating gates act as storage electrodes for the memory cells. Information can be stored in each transistor as charge on the transistor floating gate and can be read by sensing the analog threshold voltage of the transistor. The floating gate is surrounded by dielectric which allows the charge to be stored and retained on the floating gate in the absence of external power. However, the charge stored on a floating gate is subject to retention effects (charge leakage over time) and/or disturb effects (changes in the stored charge caused by local electrical signals).

Retention relates to the non-volatility of the memory cells during periods of storage, e.g., without power. Charge stored in a memory cell may need to be retained for months or even years, e.g., longer than 10 years. Even a low charge leakage rate from the memory cell can cause a data error to occur after a long retention time. Disturb effects occur when the charge stored on the floating gate of a transistor memory cell is disturbed unintentionally by local electrical signals present when other memory cells are erased, programmed, and/or read. These phenomena are respectively referred to herein as erase disturb, program disturb, and read disturb, respectively, and are referred to collectively as disturb effects. Disturb effects are dependent on the way the memory cells are connected and arise because electrical signals used to read, program, and/or erase memory cells are applied to some extent to memory cells in the circuit that are not being read, programmed or erased.

Memory cells degrade due to gate oxide breakdown which in turn is a function of the program/erase cycle experience of the memory cells. Various phenomena are related to the failure mechanisms that cause oxide degradation, including trap generation, charge trapping, and/or stress induced leakage current (SILC). Trap generation and charge trapping involves the creation and/or filling of charge traps at the interface and/or in the bulk of the gate oxide. SILC involves trap assisted tunneling of carriers through the gate oxide and has been recognized as an important constraint for decreasing memory device size.

The data stored in the memory cells can be encoded using an error correction code (ECC) capable of detecting and/or correcting errors in the data, such as those caused by charge leakage and/or disturb effects. Alternatively or additionally, it can be beneficial to implement procedures directed toward compensating for charge leakage and disturbances in the stored charge to avoid data errors.

Embodiments described herein involve methods and systems to increase data reliability in solid state memory systems by compensating for charge leakage and/or disturbances in the charge stored in the memory cell transistors. Embodiments described herein involve the use of information acquired from multiple read operations that use different reference voltages. For example, in some implementations, information from an initial read operation is used in a first decoding process and the information from the initial read operation is reused along with information from an additional read operation in a second decoding process. A reference voltage used for at least one of the read operations is shifted to compensate for expected changes in the analog voltages of the memory cells due to charge leakage and/or disturbance.

FIG. 1A is a block diagram of a memory system that includes a memory device 110 and a host processor 130. The memory device 110 includes a memory array 115 and a memory controller 120 that provides an interface between the memory array 115 and the host 130. The host 130 may be any type of computing system. The memory array 115 includes a number of memory cells, each memory cell capable of storing one or more bits of data. The data stored in each memory cell is represented as an analog voltage according to the amount of charge stored in the memory cell. As discussed in more detail below, the analog voltages of each memory cell can be converted to digital format corresponding to the one or more data bits stored in the memory cell. The conversion of data stored in a memory cell to digital format may involve sensing the analog voltage of the memory cell and comparing the analog voltage to one or more reference voltages, for example. A block diagram of exemplary circuitry required to sense the analog voltages of the memory cells and to perform the reference voltage comparisons is represented illustrated in FIG. 1A as the voltage sense circuitry 117 and comparator circuitry 118.

Figure 1B:
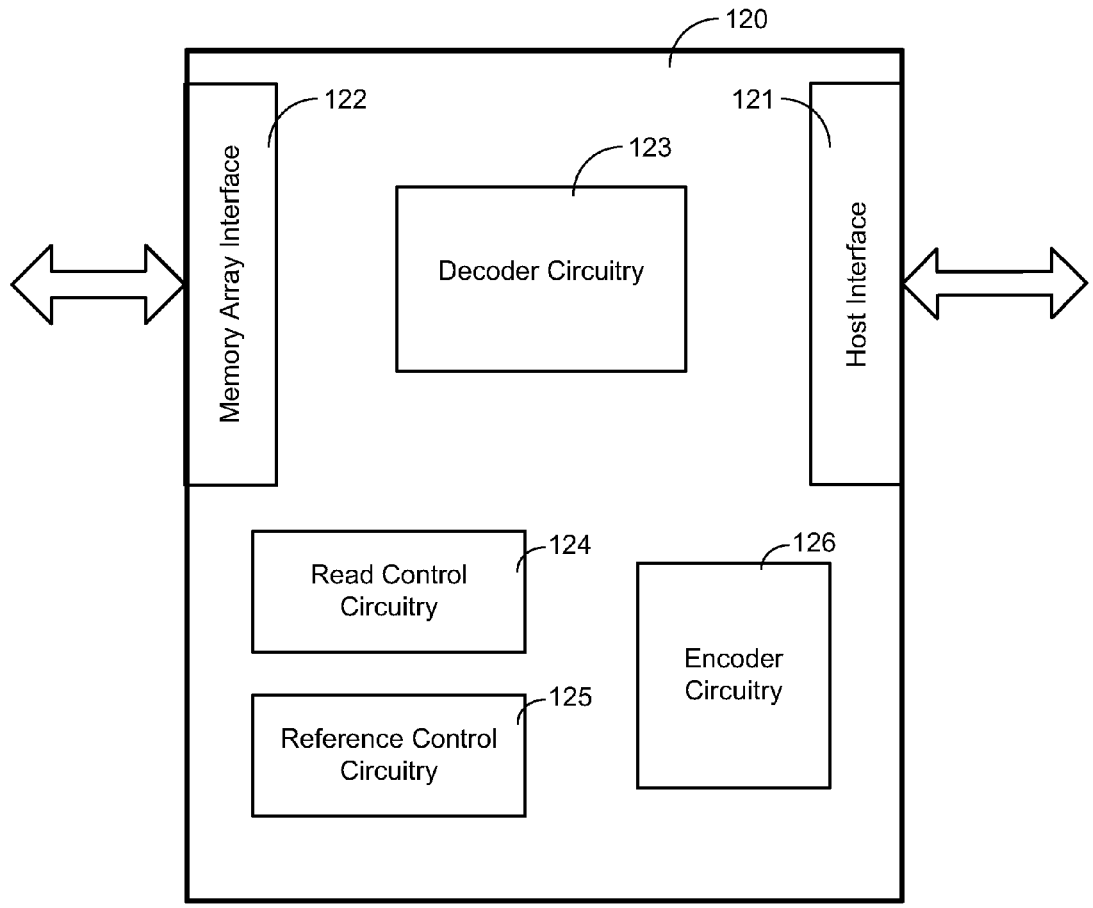
FIG. 1B is a block diagram that illustrates the memory controller of FIG. 1A in more detail.

FIG. 1B illustrates the memory controller 120 in more detail. A host interface 121 facilitates the transfer of data and control signals between the memory controller 120 and the host 130. Data is transferred from the host 130 through the memory controller 120 and then to the memory array 115 for storage. Prior to storage of the data in the memory array 115, the data may be encoded by the encoder circuitry 126 using an error correcting code (ECC). The encoded data is then transferred via the memory array interface 122 from the controller 120 to the memory array 115 for storage in the memory cells of the memory array 115.

When the host 130 requests the stored data from the memory array 115, the encoded data is read from the memory array 115 and is decoded by decoder circuitry 123 using the ECC. The decoded data is transferred to the host 130 via the host interface 121. The decoder 123 uses the ECC to attempt to correct errors that are present in the data read from the memory array 115. The data errors may arise, for example, due to noise during the read and/or write operations and/or due to data corruption caused by charge leakage and/or erase/program/read disturbs as mentioned above. The memory controller 120 may also include circuitry 124 that generates control signals used to control the read operations of the memory array 115 and/or circuitry 125 configured to calculate the reference voltages used in the read operations as described herein.

Figure 2:
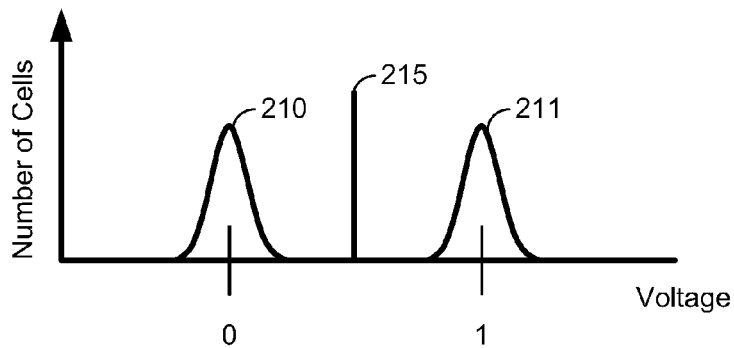
FIG. 2 depicts voltage distributions of a single level cell (SLC) memory device.

The memory array 115 may be a single level cell (SLC) or multi-level cell (MLC) memory array. Single level cells are capable of storing one bit of data per memory cell. In SLC devices, a logical one is represented as a first analog voltage and logical zero is represented as a second analog voltage. Each memory cell has slightly different characteristics, e.g., random variations of critical dimensions, thickness, and doping, and/or other factors. The differences in the characteristics of the memory cells can lead to different sensitivity to wear from cell to cell. The analog voltages representing the zeros or ones in a memory array (or a data unit of the memory array, such as a page or block) have a distribution of voltages, as illustrated by the idealized voltage distributions 210, 211 depicted in FIG. 2. In this example, voltage distribution 210 is associated with a logical zero and voltage distribution 211 is associated with a logical one. The spread of the distributions is influenced by the speed of the write operation process. There is a tradeoff between the time that the write operation takes and the width of the voltage distribution achieved. As the memory cells wear, they are more susceptible to leakage and disturb effects which cause shifts the distributions. These shifts can be compensated for at least to some extent by increasing the time of the write operation. However, increasing the write time leads to slower memory which is generally not preferred.

Figure 3:
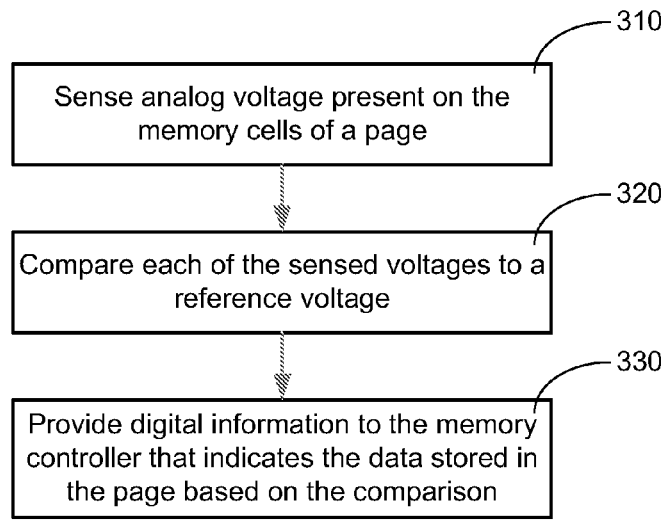
FIG. 3 is a flow diagram illustrating a memory read operation for a memory cell of an SLC memory device.

FIG. 3 is a flow diagram illustrating a memory read operation for an SLC device. The voltage of the memory cell is sensed 310 and is compared 320 to a reference voltage, such as reference voltage 215 depicted in FIG. 2. The reference voltage 215 is selected to provide a clear distinction between voltages falling within distribution 210 associated with a logical zero from voltages falling within the distribution 211 associated with a logical one. If the sensed voltage of the memory cell is less than the reference voltage 215, then the data stored in the memory cell is interpreted as a logical zero. If the sensed voltage of the memory cell is greater than the reference voltage 215, then the data stored in the memory cell is interpreted as a logical one. The digital information resulting from the comparison is provided 330 to the memory controller. In a typical scenario, memory cells are read in groups, such as a page or block of memory cells, and an entire page or block of data would be provided to the memory controller for each data read operation.

Figure 4A:
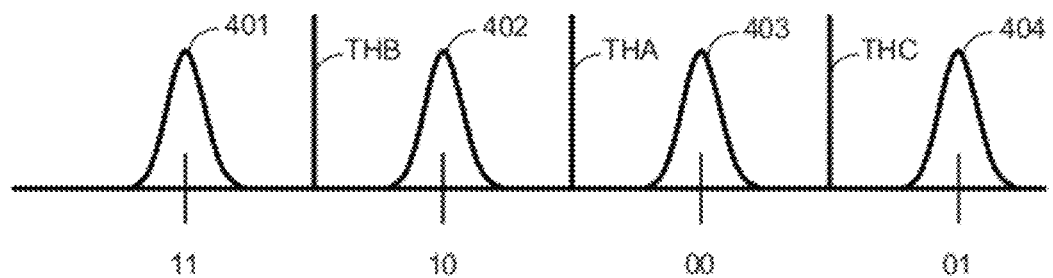
FIG. 4A depicts voltage distributions and reference voltages of a multi level cell (MLC) memory device.

Multi-level cell (MLC) memory devices are capable of storing multiple bits per memory cell. For example, two, three, or more bits may be stored in an MLC memory cell. Typical voltage distributions for an MLC memory array capable of storing two bits per memory cell are illustrated in FIG. 4A. In this example, the digital symbol 11 requires the lowest voltage and may represent the erased state. Voltage distribution 401 is associated with the digital symbol 11, voltage distribution 402 is associated with digital symbol 10, voltage distribution 403 is associated with the digital symbol 00, and voltage distribution 404 is associated with the digital symbol 01. For each digital symbol, the digit on the left is the most significant bit (MSB) and the digit on the right is the least significant bit (LSB).

Reading the digital state of a memory cell may be accomplished by comparing the sensed voltage levels of the MLC memory cells to one or more reference voltages, represented as THA, THB, THC in FIG. 4A. Comparison to a first reference voltage, THA, discriminates the MSB bit of the digital state stored in the memory cell. If the sensed voltage is lower than THA, then the state of the MSB is 1 and if the sensed voltage is greater than THA, then the state of the MSB is 0.

Reading the LSB requires comparison to an additional reference voltage. If the sensed voltage is less than THA, then comparison to reference THB discriminates between an LSB of 1 and an LSB of 0. If the sensed voltage is less than THAB, then the LSB stored in the memory cell is 1. If the sensed voltage is greater than THB, then the LSB stored in the memory cell is 0. If the sensed voltage is greater than THA, then comparison to reference voltage THC discriminates between an LSB of 1 and an LSB of 0. If the sensed voltage is greater than THC, then the LSB is 1. If the sensed voltage is less than THC, then the LSB is 0.

The distances between the edges of the distributions 401, 402, 403, 404 and the location of the reference voltages THA, THB, THC affect the error rate of the memory cells. If any of the voltage distributions overlap the reference voltages THA, THB, THC, then data errors are likely to occur. Thus it is desirable to maintain acceptable distribution margins between the edges of the distributions and the reference voltages THA, THB, THC.

Program disturb, read disturb, erase disturb, charge leakage over time, and/or other factors can change the analog voltage stored in memory cells, causing the voltage distributions for a memory device (or a unit of data of a memory device, such as a data page) to change and to overlap the reference voltages. The susceptibility to change and/or the amount of voltage shift experienced by any particular memory cell may vary from one memory device to another, may vary from one memory cell page to another, may vary from memory cell to memory cell within a memory page, and/or may vary depending on the history of the memory cell. For example, each memory cell page or block of a memory device may have a unique history with regard to program/erase cycles. Susceptibility to charge leakage and/or charge disturbs typically increases with number of erase/program cycles experienced by the memory cells.

The amount, direction and/or susceptibility of voltage change may vary depending on the digital symbol being represented by the analog voltage. For example, a memory cell storing a higher voltage may be more susceptible to charge leakage than memory cells storing lower voltages. Memory cells storing lower voltages may be more susceptible to disturb effects than memory cells storing higher voltages.

Figure 4B:
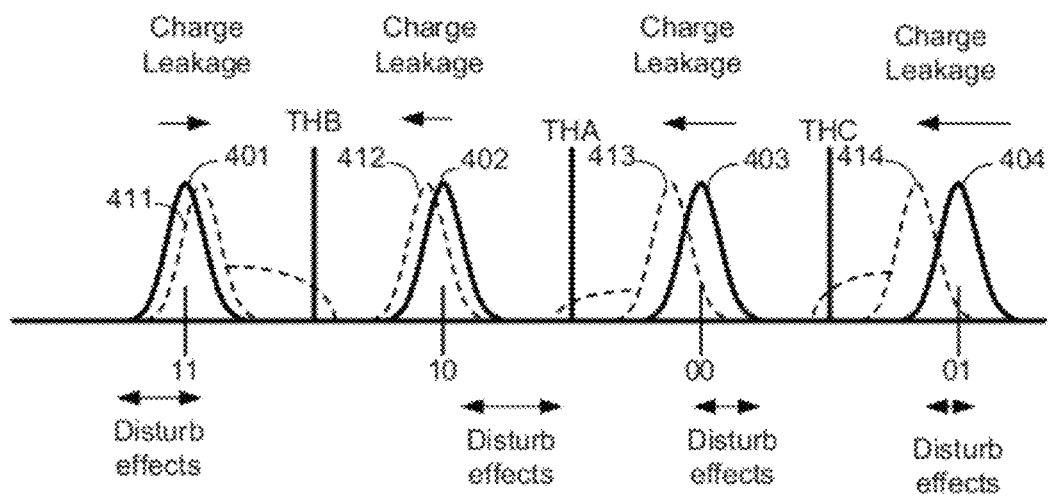
FIG. 4B illustrates the shift in memory cell voltages due to charge leakage and disturb effects.

FIG. 4B illustrates the shifted voltage distributions 411, 412, 413, 414 after the initial voltage distributions 401, 402, 403, 404 are shifted and distorted due to charge leakage and/or disturb effects. For example, charge leakage may cause the voltage distributions 402, 403, 404 to shift from a higher voltage to a lower voltage as charge leaks from the memory cells. Memory cells storing symbols represented by higher voltages, e.g., symbols 00 and 01 in FIG. 4B, may experience a larger charge leakage shift than symbols represented by lower voltages, e.g., symbols 10 in FIG. 4B. In FIGS. 4A and 4B, digital symbol 11 is represented by a negative voltage and symbols 10, 00, and 01 are represented by positive voltages. Note that the negative voltage distribution 401 representing the digital symbol 11 exhibits shift which is opposite in direction to the shifts of the positive distributions 402, 403, 404.

FIG. 4B also depicts that disturb effects that may operate to shift the voltage of a memory cell in the same direction as retention charge leakage or a direction opposite to the voltage shift caused by retention charge leakage. Disturb effects tend to add charge to a floating gate, thereby increasing the analog voltage of the memory cell. Smaller voltages stored on a memory cell correspond to a smaller amount of charge which can make the memory cell storing a lower analog voltage more sensitive to program/read/erase disturbs which add charge to the floating gate. Thus, memory cells storing an analog voltage representing the digital symbol 10 in FIG. 4A may be more sensitive to program/read/erase disturbs than memory cells storing an analog voltage representing the digital symbol 01, for example.

Figure 5A:
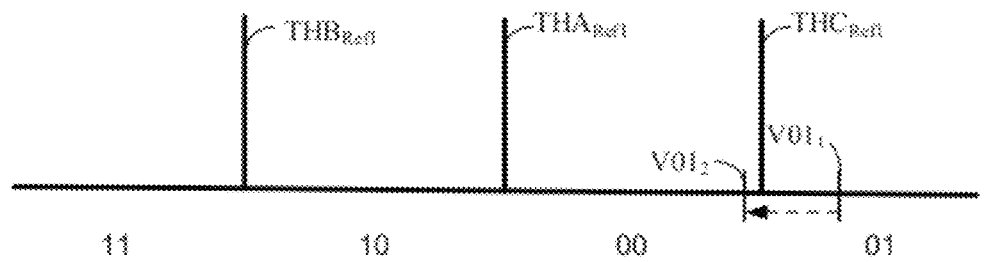
FIG. 5A illustrates a voltage shift due to charge loss from a memory cell.

For purposes of illustration, FIG. 5A depicts a scenario wherein an analog voltage, $V01_1$, representing the digital symbol 01, has been programmed into a memory cell.

Immediately after programming the memory cell, the digital symbol stored in the memory cell can be read by sensing the voltage $V01_1$ and comparing the voltage $V01_1$ to a nominal reference voltage $THC_{Ref1}$. Because $V01_1$ is greater than the nominal reference voltage $THC_{Ref1}$, the digital symbol stored in the memory cell is correctly identified and transferred to the memory controller as 01.

However, due to charge leakage, which is a predominant mechanism for changes in the voltage distribution for this symbol, electrons stored on the floating gate of the memory cell can leak away, causing the voltage of the memory cell to decrease to voltage $V01_2$. If the memory cell is read after the charge leakage, comparison of the analog voltage $V01_2$ to the nominal reference voltage, $THC_{Ref1}$ leads to erroneous identification of the digital symbol stored in the memory cell as 00 rather than 01. This erroneous value is transferred from the memory array to the memory controller, where the decoder circuitry attempts to decode the data. The data may include too many errors to allow convergence.

Figure 5B:
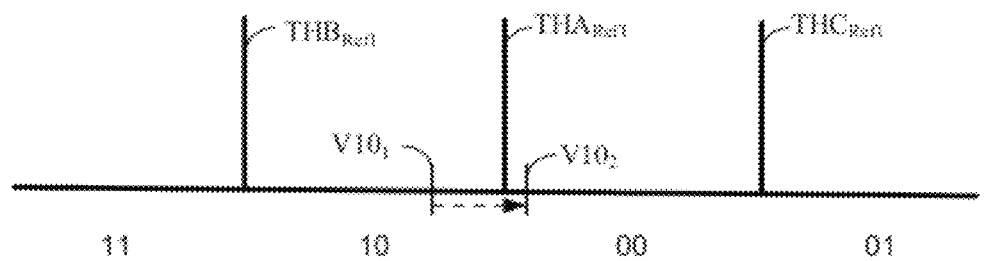
FIG. 5B illustrates a voltage shift due to charge gain of a memory cell.

FIG. 5B illustrates a scenario in wherein an analog voltage, $V10_1$, representing the digital symbol 10, has been programmed into a memory cell. Immediately after programming the memory cell, the digital symbol stored in the memory cell can be read by sensing the voltage $V10_1$ and comparing the voltage $V10_1$ to a nominal reference voltage $THA_{Ref1}$. Because $V10_1$ is less than the nominal reference voltage $THA_{Ref1}$, the digital symbol stored in the memory cell is correctly identified and transferred to the decoder circuitry in the memory controller as 10. However, the voltage of the memory cell may be disturbed when other memory cells are erased, read and/or programmed causing additional electrons to be stored on the floating gate of the memory cell. The disturb effects result in an increase in the memory cell voltage from voltage $V10_1$ to voltage $V10_2$. If the memory cell is read after the voltage change occurs, comparison of the analog voltage $V10_2$ to the nominal reference voltage, $THA_{Ref1}$ leads to an erroneous interpretation of the digital symbol stored in the memory cell as 00. The decoder circuitry of the memory controller attempts to decode this erroneous data.

Figure 5C:
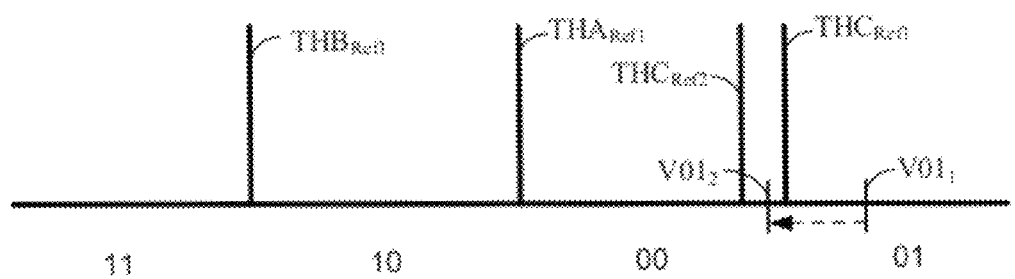
FIG. 5C illustrates a reference voltage shift that compensates for a decrease in memory cell voltage.
Figure 5D:
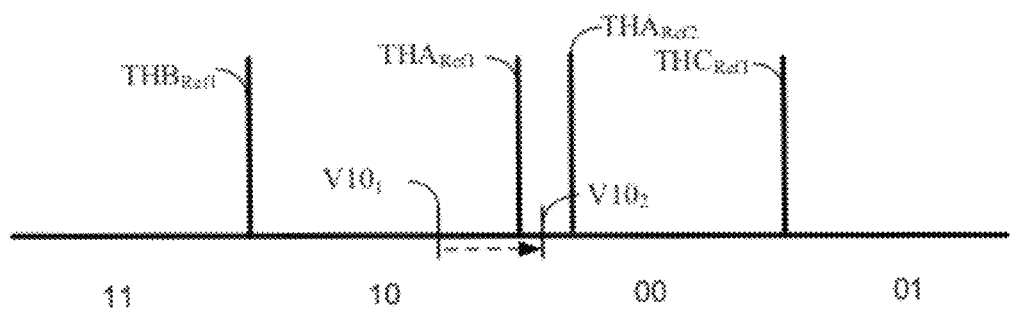
FIG. 5D illustrates a reference voltage shift that compensates for an increase in memory cell voltage.

In the scenarios described in connection with FIGS. 5A and 5B, the voltage change from $V01_1$ to $V01_2$ or $V10_1$ to $V10_2$ may be taken into account and compensated for by shifting the reference voltages used to interpret the data. For example, as illustrated in FIG. 5C, lowering the reference voltage from the nominal reference voltage, $THC_{Ref1}$, to a shifted reference voltage, $THC_{Ref2}$, allows the digital symbol represented by $V01_2$ to be correctly interpreted as 01 rather than erroneously interpreted as 00. Comparison of the analog voltage $V01_2$ to shifted reference voltage $THC_{Ref2}$ indicates that $V01_2$ is greater than $THC_{Ref2}$ leading to the correct interpretation of the digital symbol stored in the memory cell as 01. Similarly, increasing the reference voltage from the nominal reference voltage $THA_{Ref1}$ to the shifted reference voltage $THA_{Ref2}$ as depicted in FIG. 5D allows the digital symbol represented by $V10_2$ to be correctly interpreted as 10.

Errors present in data read from memory cells can often be identified and/or corrected in the decoder circuitry using an error correcting code (ECC). Some decoders implement hard decoding processes which only take into account hard data, i.e., digital symbols identified by performing the comparison of sensed analog voltages to the reference voltage. Some decoders, such as Low Density Parity Check (LDPC) decoders can also implement soft decoding processes which, in addition to the hard data, also take into account additional soft information. Soft information may comprise, for example, information from an additional read operation that uses a shifted voltage reference threshold, and/or may comprise error probabilities based on channel noise characteristics.

In some implementations, the soft information is expressed as the log likelihood ratio (LLR). For each data bit, $b_i$, the LLR can be defined based on the probability ratio $p(b_i=0|y)/p(b_i=1|y)$ where $p(b_i=0|y)$ is the probability that bit $b_i$ is a 0 and $p(b_i=1|y)$ is the probability that bit $b_i$ is a 1. The LLR for each bit may be expressed in terms of a signed number. For example, the signed numbers can range from +10 to −10. The sign of the number represents the likely state of the bit, with a positive sign representing the logic state 0 and a negative sign representing the logic state 1. The magnitude of the number represents the degree of confidence in the estimated logic state. For example, a +1 output from the decoder can indicate that the bit is estimated to be a logic zero, but confidence is low. A +5 can indicate that the bit is estimated to be a logic zero and a +10 can represent that the bit is estimated to be logic zero with high confidence. A −4 indicates that the bit is probably a logic one.

Figure 6:
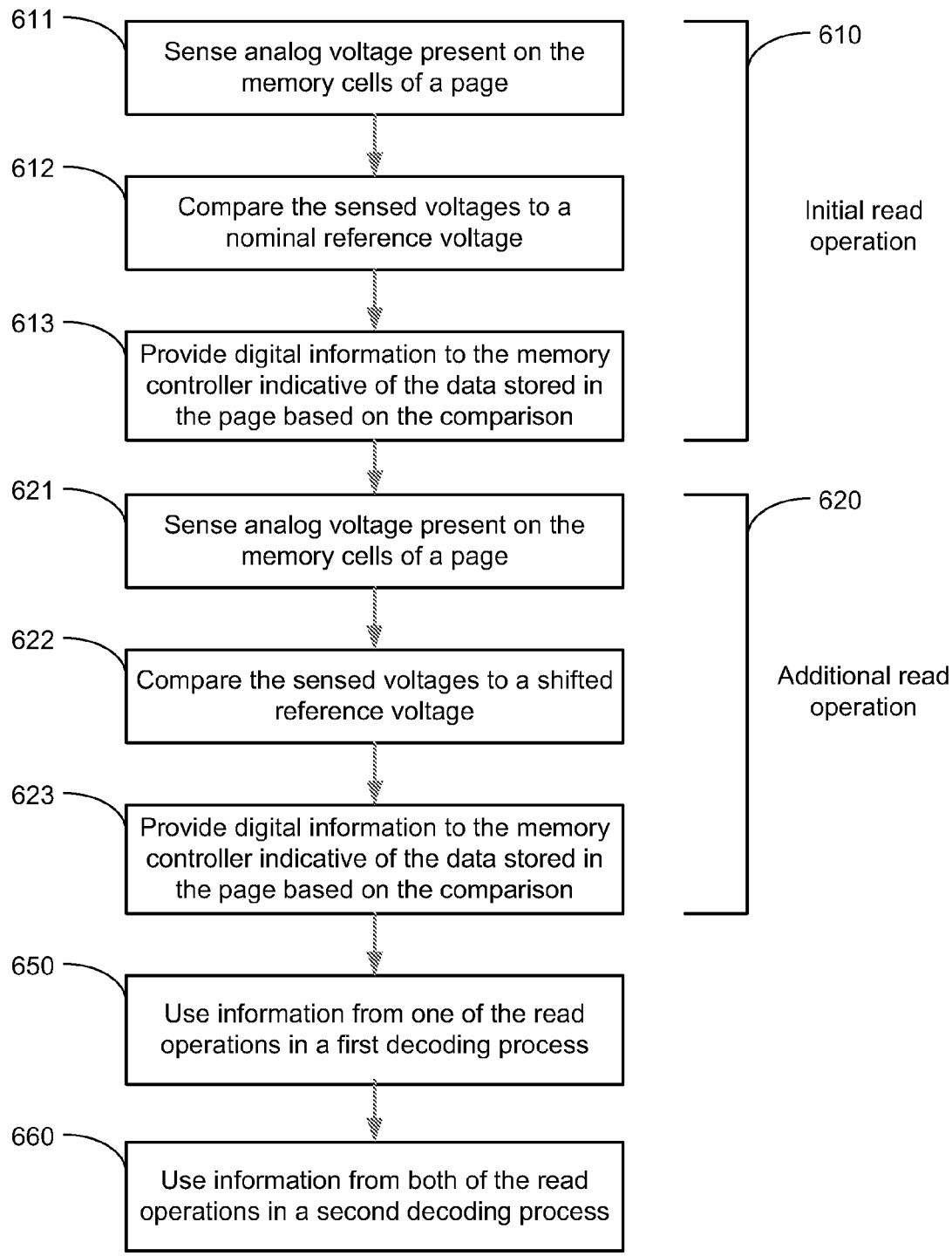
FIG. 6 is a flow diagram illustrating the use of information from two SLC read operations.

Embodiments described herein involve using information acquired from an initial read operation in a first decoding process and reusing the information from the initial read operation along with information acquired from an additional read operation in a second decoding process. In some implementations, the first decoding process comprises a hard decision decoding process that uses information from one of the read operations and the second decoding process comprises a soft decision decoding process that uses information from two or more read operations. FIG. 6 is a flow diagram that illustrates the use of information from two read operations 610, 620 of a page of an SLC memory array. Although for purposes of illustration, embodiments are described for SLC memory arrays, it will be appreciated that the concepts described herein also encompass MLC memory arrays.

Each of the read operations 610, 620 compares the sensed analog voltage of the memory cell to different reference voltages. In the initial read operation 610, the voltages of the memory cells of the page are sensed 611 and are compared to a first reference voltage 612, for example, the usual or nominal reference voltages used for the memory cell array. In the additional read operation 620, the voltages of the memory cells of the page are sensed 621 and are compared 622 to a shifted reference voltage. The shifted reference voltage is shifted from the nominal reference voltage in a direction that compensates for an expected change in the voltages of the memory cells. In some embodiments, the initial read operation uses the shifted reference voltage and the additional read operation uses the nominal reference voltage.

Digital information from the initial read operation and the additional read operation is provided 613, 623 to the memory controller. The digital information received in the memory controller from one of the multiple read operations is used 650 in a first decoding process, e.g., to perform hard decision decoding. For example, the digital information received from one of the multiple read operations is used without using information from other ones of the multiple read operations. The digital information received in the memory controller from a least two of the multiple read operations is used 660 in a second decoding process, e.g., to perform soft decision decoding. For example, in subprocess 650, information from the initial read operation 610 may be used in the first decoding process without using the information from the additional read operation 620. Information from the additional read operation 620 may be used in the first decoding process without using the information from the initial read operation

610. Subprocess 660 uses the read information not used in subprocess 650 (information from either the additional read operation 620 or initial read operation 610) and reuses the read information that was previously used in subprocess 650. Note that the subprocesses 610, 620, 650, 660 illustrated in the flow graph of FIG. 6 (and other subprocesses in flow diagrams described elsewhere herein) need not be performed in series and/or sequentially and may be performed partially or fully in parallel and/or concurrently. Designation of subprocesses 610 and 620 as initial and additional read operations is not intended to convey that the initial read operation is necessarily performed first in time before the additional read operation. Designation of subprocesses 650 and 660 as first and second decoding processes is not intended to convey that the first decoding process is necessarily performed first in time before the second decoding process is performed.

In some embodiments, whether or not a read operation is performed is contingent on the outcome of previous decoding attempts. For example, in some implementations, a first decoding process uses information from an initial read operation, e.g., using a nominal reference voltage. One or more additional read operations, e.g., using shifted reference voltages, are requested by the control circuitry of the memory controller only if the first decoding process fails to achieve convergence. If the first decoding process achieves convergence, then the one or more additional read operations are not requested. If the additional read operations are requested, the second decoding process uses the information read from memory cells in the additional read operations and may also use the information read from the memory cells in the initial read operation. In some embodiments, after the additional read operation is requested and the second decoding process is performed, additional read operations may be requested and additional decoding processes may be performed.

For example, in some embodiments, the first decoding process performs hard decision decoding using the information from the initial read operation, without using information from any additional read operations. The second decoding process performs soft decision decoding using both the information from the initial read operation and the information from the additional read operation. In some embodiments, the initial decoding process performs soft decision decoding using the information from the initial read operation without using information from any additional read operations. For example, the initial decoding process may perform soft decision decoding using the information from the initial read operation along with channel characteristic information, e.g., noise probabilities.

In some implementations, the initial read operation may use a shifted reference voltage that is shifted from the nominal reference voltage and at least one additional read operation may use the nominal reference voltage. In other implementations, the initial read operation may use the nominal reference voltage and one or more additional read operations may use a shifted reference voltage. The shifted reference voltage may be shifted from the nominal reference voltage in a direction that compensates for an expected change in the analog voltage of the memory cells. For example, if the disturbing phenomena, e.g., erase/program/read disturbs, are expected to increase the analog voltage of the memory cells, then the shifted reference voltage may be increased. If the disturbing phenomena, e.g., charge leakage over time, are expected to decrease the analog voltage of the memory cells, then the shifted reference voltage may be decreased to compensate for charge leakage from the memory cells over time.

Figure 7A:
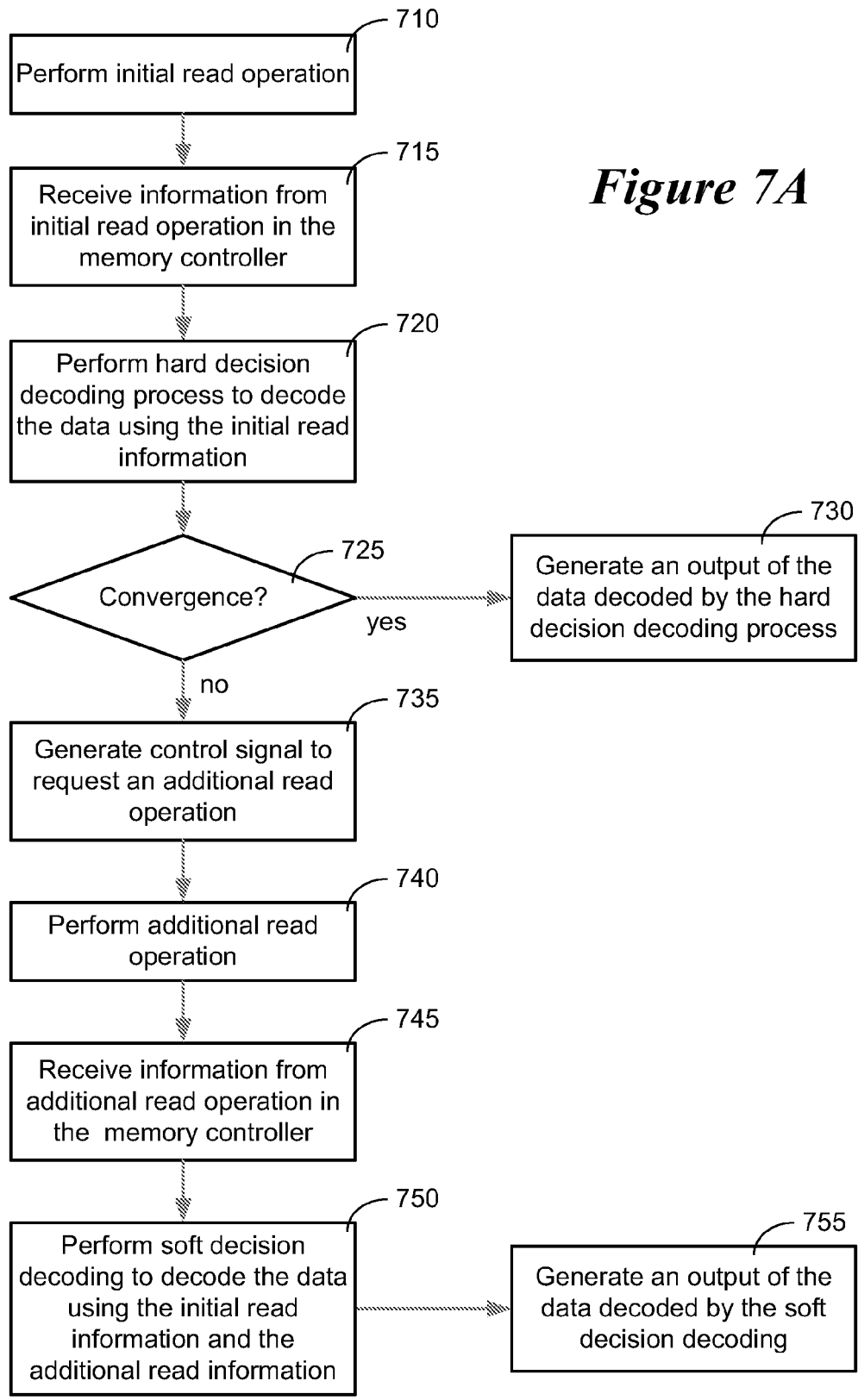
FIG. 7A is a flow diagram that illustrates a process of requesting a read operation contingent on the outcome of the initial decoding process

The flow diagram of FIG. 7A illustrates the process of requesting a read operation contingent on the outcome of the first decoding process. In this example, the information from the initial read operation is used for hard decision decoding. Both the information from the initial read operation and the information acquired from the additional read operation is used in a decoding process, e.g., a soft decision decoding process.

Referring to FIG. 7A, an initial read operation is performed 710 and the information from the initial read operation is received 715 by the memory controller. For example, for flash memory the read operation may typically encompass an entire page or block of data. A first decoding process, e.g., hard decision decoding is performed 720 using the information from the initial read operation. In alternative implementations, the initial decoding process may perform soft decision decoding. For example, if soft decision decoding is used, the soft decision decoding may use the first read information (without using information from any additional read operations), and information derived from the channel noise characteristics.

If the first decoding process successfully achieves convergence 725, then an output of the data stored in the memory page is generated 730 and may be provided to a host computer. If the first decoding process does not achieve convergence 725, then the control circuitry of the memory controller generates 735 a control signal that initiates an additional read operation. The additional read operation is performed 740 and the information from the additional read operation is received 745 in the memory controller. A second decoding process, e.g., soft decision decoding, is performed 750 using the information from the initial read operation and the information from the additional read operation. If the additional read operation successfully achieves convergence, then an output of the successfully decoded data may be provided 755 to the host computer. In some implementations, the nominal reference voltage is used the initial read operation and a reference voltage shifted form the nominal to compensate for an expected change in the analog voltages of the memory cells is used in the additional read operation.

In some implementations, multiple read operations and decoding processes operate at least in part concurrently. If multiple read operations are to be performed, the decoder circuitry may opportunistically attempt to decode the data using the initial read operation before the results of the additional read operations are available. If the opportunistic attempt to decode the data using the information from the initial read operation achieves convergence, then a control signal is generated that is used to cancel the additional read operations and/or decoding process that uses information from the additional read operations.

Figure 7B:
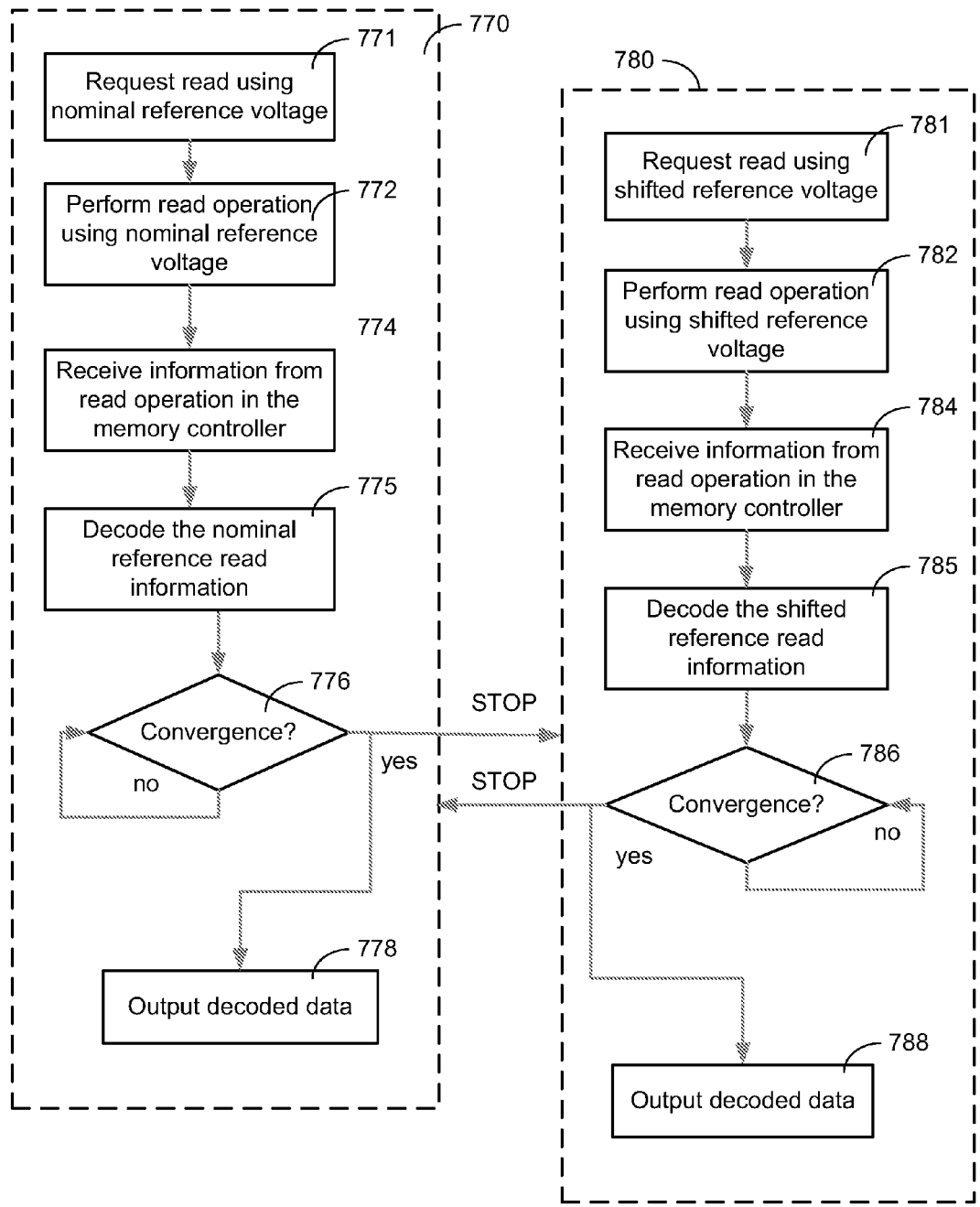
FIG. 7B is a flow diagram illustrating the use of a control signal to cancel a concurrently operating process.

FIG. 7B illustrates two read/decode processes 770 and 780 that operate at least in part concurrently. The read operation 772 of process 770 uses a nominal reference voltage and the read operation 782 of process 780 uses a reference voltage that is shifted from the nominal reference voltage to compensate for an expected change in the voltage of the memory cell. The memory controller requests 771 an initial read operation using the nominal reference voltage. The memory controller also requests 781 a read operation using the shifted reference voltage. The memory device may process read requests serially with respect to time, e.g., first performing the nominal voltage read operation and then performing the shifted reference voltage read operation or first performing the shifted reference read operation and then performing the nominal voltage read operation. The read operation using the nominal reference voltage and the read operation using the shifted reference voltage are performed 772, 782 and the read information is provided 774, 784 to the memory controller. The nominal reference read information and the shifted reference read information is decoded 775, 785. If decoding using the nominal reference read information achieves convergence, the decoded data is output 778 and a control signal is generated that is used to stop process 780. If decoding using the shifted reference read information achieves convergence, the decoded data is output 788 and a control signal is generated that is used to stop process 770.

In some implementations the initial read operation is requested 771 before the additional read operation is requested 781. The decoder opportunistically attempts to decode 775 the data using the information from the initial read operation while the information from the additional read operation is being performed 782. If the decoder achieves convergence 776 of the data using the information from the initial read operation, then the additional read and decoding process 780 is canceled using a control signal.

Mechanisms for the previously mentioned phenomena that cause data corruption (disturbances due to read, program, erase cycles, and/or long data storage times) are known and to some extent can be alleviated by physical design of a flash array and/or by programming approaches that reduce data errors. Alternatively or additionally, it can be useful to anticipate and compensate for these disturbances by shifting reference voltages used during read operations of the memory cell. In some implementations, the memory system may be capable of determining the amount of voltage shift used for the shifted reference voltage. For example, the memory controller may include reference voltage control circuitry configured to calculate the amount of voltage shift from the nominal reference voltage based on configuration and use factors of the memory cells. The configuration and use factors may include the physical and material configuration of the memory cell, e.g., dimensions, thickness, and doping, etc., the charge currently stored on the memory cell (also expressed as the voltage of the memory cell), the history of program/erase cycles experienced by the memory cell, the type of data page stored by the memory cell, e.g., MSB page or LSB page, the history of data errors of the memory cell, the history of read, write, and erase operations performed on other memory cells that can potentially affect the charge stored on the memory cell, the length of time that charge has been stored on the memory cell, the temperature of the memory cell at the time of the program operation, the temperature of the memory cell at the time of the read operation, and/or other configuration and use factors. In some implementations, the reference voltage control circuitry may calculate the voltage shift as a function of only one of these configuration and use factors, e.g., data retention time. In some implementations, the reference voltage control circuitry may calculate the voltage shift as a function of multiple configuration and use factors.

The configuration and use factors may operate interdependently. For example, the rate of charge leakage from a memory cell may increase with the number of program/erase cycles experienced by the memory cell. Analog voltages representing certain data symbols may make the memory cell more susceptible to charge loss or charge gain than other analog voltages that represent other data symbols. For example, with reference to FIG. 4, if the memory cell is programmed with an analog voltage that initially represents the 01 symbol the memory cell may be more susceptible to charge loss than if the cell was programmed to an analog voltage representing the 11 symbol.

The shift in the voltage of a memory cell, $\Delta_P$, due to use factors $U_1, U_2, U_3, \ldots U_J$ may be determined using the charge loss/gain model of the memory cell, expressed as $f(U_1, U_2, U_3, \ldots U_J)$, where $U_1, U_2, U_3 \ldots U_J$ are use factors such as those listed above. The amount of change of the voltage stored in a memory cell due to each use factor $U_1, U_2, U_3, \ldots U_J$ may be estimated based on an a priori characterization of a population of similar memory cells before the memory cell is in use, or may be estimated based on an a posteriori characterization of the memory cell (or other similar memory cells of the same memory device) during the time that the memory cell is in use. For example, when a prior population data is used, then the shifted reference voltage may be calculated:

$$V\text{Ref}_{shifted} = V\text{Ref}_{nominal} + \Delta_P$$

where $\Delta_P$ is the expected voltage shift determined using the charge/loss gain model $f(U_1, U_2, U_3, \ldots U_J)$ of the memory cell derived from population data.

In some implementations, some or all of the memory cells of a memory array may be characterized to model the charge loss/charge gain behavior of particular memory cells, or units of memory cells, e.g., blocks or pages of memory cells, a posteriori, i.e., during the time that the memory array is in use. For example, characterization of the memory cells may be performed during an appropriate time, such as during garbage collection. The shifted reference voltage may then be calculated based on the characterization of the memory cells. Characterization of the memory cells may occur numerous times over the life of the memory device, allowing rates of change in charge loss or gain behavior for each use factor or multiple use factors to be calculated These calculated rates of change can be used to extrapolate the expected changes from the use factors.

For example, when a posteriori memory cell characterization data is used, then the shifted reference voltage may be calculated:

$$V\text{Ref}_{shifted} = V\text{Ref}_{nominal} + \Delta_C,$$

where $\Delta_C$ is the expected voltage shift determined using the charge loss/gain model, $f(U_1, U_2, U_3, \ldots U_J)$ of the memory cell derived from one or more characterization of the memory cell or memory cell array. In some implementations, the charge loss/gain model of the memory cell may be derived using a priori population data for use some factors and a posteriori characterization of the memory cell for other use factors. In some implementations, the charge loss/gain model may be adaptive. For example, a priori population data may initially be used to generate the charge loss/charge gain model, but as characterization data for the memory cell array is acquired, the charge loss/charge gain model may increasingly rely on the information acquired from the a posteriori characterization.

Figure 8:
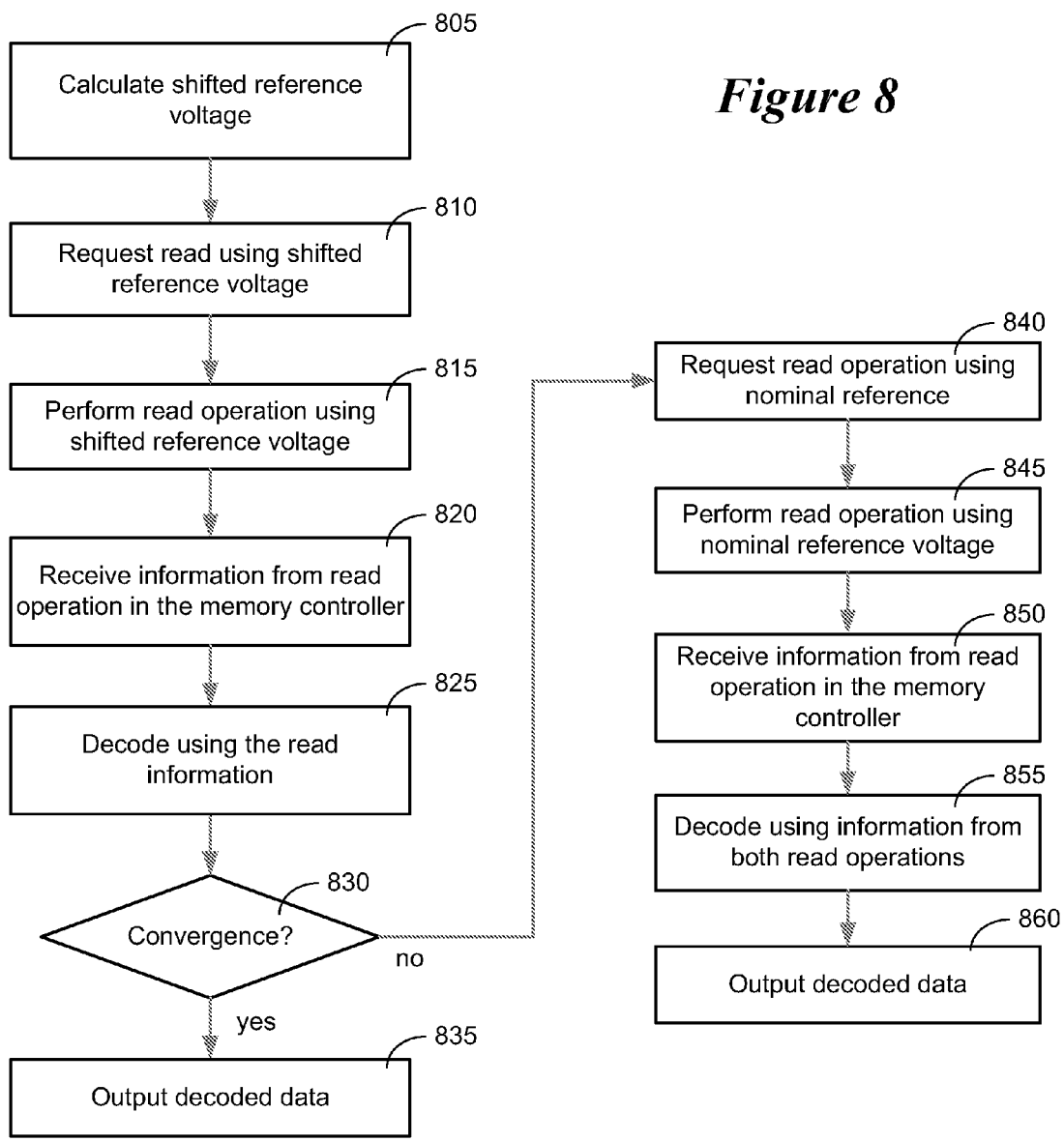
FIG. 8 is a flow diagram of memory read and decoding operations which involve calculating a shifted reference voltage.

FIG. 8 is a flow diagram illustrating memory read and decoding operations which involve calculating a shifted reference voltage. The calculation may use a charge gain/loss model that is based on memory cell population data and/or on characterization of the memory cell. With reference to FIG. 8, the reference control circuitry calculates 805 a shifted reference voltage, e.g., based on the charge/loss gain model of the memory cell. A read operation that uses the shifted reference voltage is requested 810 by the memory controller. The memory device performs 815 the requested read operation and provides 820 the information from the requested read operation to the memory controller. The decoder circuitry of the memory controller attempts to decode 825 the data stored in the memory cells, e.g., using hard decision decoding. If the decoding process successfully achieves convergence 830, then the decoded data is output 835 to the host processor.

If convergence is not achieved 830, then the memory controller requests 840 a read operation using the nominal reference voltage. Alternatively, the reference voltage controller circuitry may recalculate another shifted reference voltage, e.g., based on a different charge gain/loss model and the memory controller requests a read operation using the newly calculated shifted reference voltage. The memory device performs 845 the requested read operation and returns 850 the information obtained from the read operation to the memory controller. The decoder circuitry attempts to decode 855 the data using information from both the read operations. For example, the decoder circuitry may perform soft decision decoding using both the information from the read operation that uses the shifted reference and the read operation that uses the nominal reference. If convergence is achieved, a decoded output is provided 860 to the host processor.

Figure 9A:
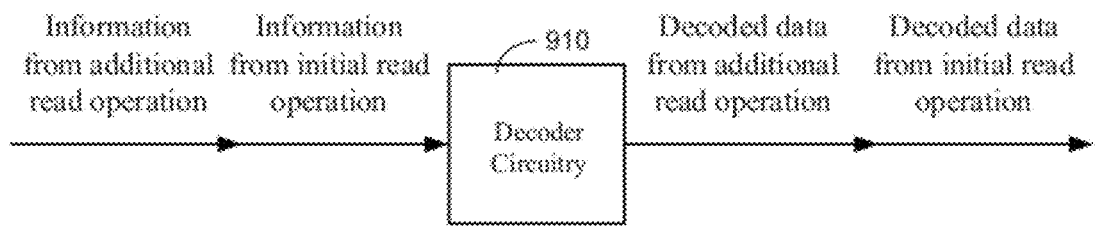
FIG. 9A is a block diagram that illustrates a time multiplexed decoder implementation.
Figure 9B:
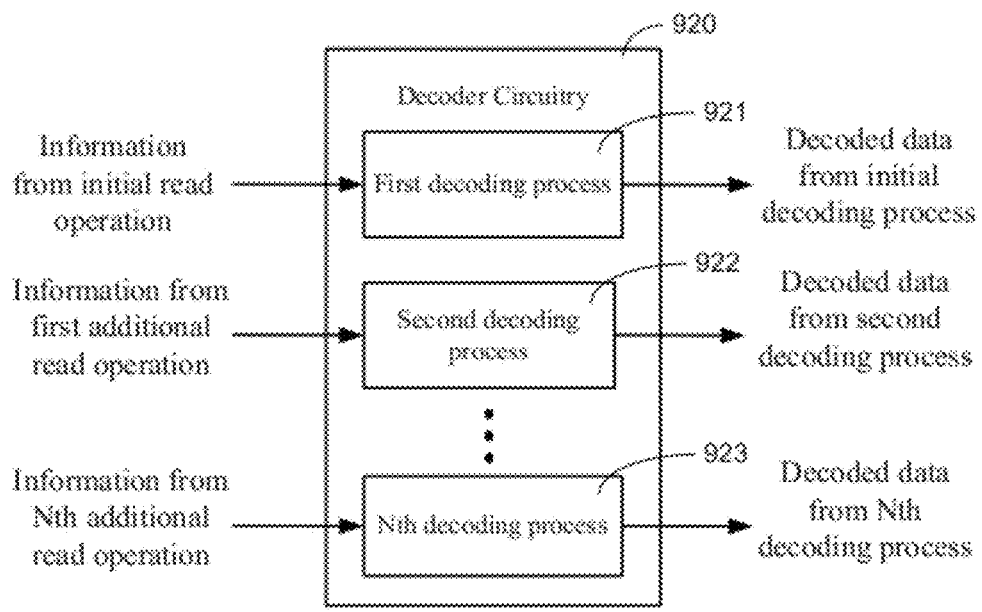
FIG. 9B is a block diagram that illustrates a decoder implementation that includes multiple concurrently operating decoding processes.

FIGS. 9A and 9B illustrate various configurations of the decoder circuitry 123 (see, FIG. 1B) that may be used to decode the data using information from one or more read operations. FIG. 9A illustrates a time multiplexed implementation wherein the information from the initial read operation and the information from the additional read operations are performed sequentially by the decoder circuitry 910. In FIG. 9A, the information received from the initial read operation is decoded prior to decoding the information received from the additional read operation.

In some embodiments, multiple decoding processes may occur at least in part concurrently. For example, as illustrated in FIG. 9B, decoder circuitry 920 may include circuitry for multiple decoding processes 921, 922, 923 and the decoding processes 921, 922, 923 may be implemented at least in part concurrently. As illustrated in FIG. 9B, information from an initial read operation may serve as an input to a first decoding process 921, information from additional read operations may respectively serve as inputs to additional decoding processes 922, 923.

Figure 10:
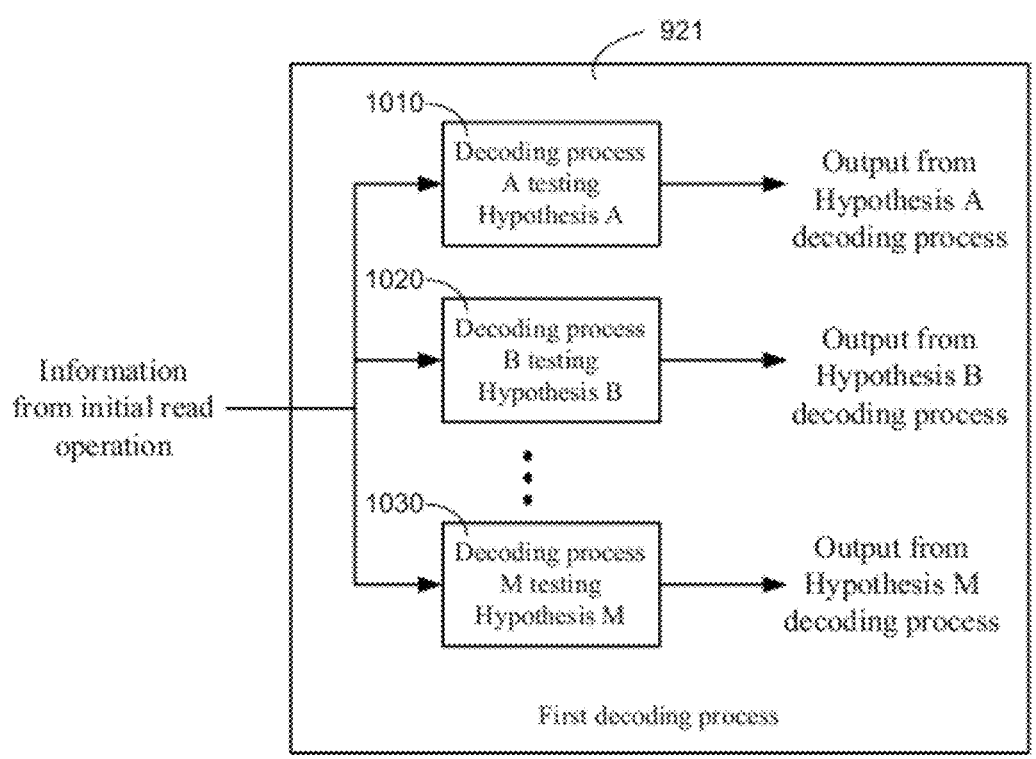
FIG. 10 is a diagram illustrating decoder circuitry configured to test multiple hypotheses.

Each of the decoding processes illustrated in FIGS. 9A and 9B, whether the information from multiple read operations is processed sequentially as in FIG. 9A or partially or fully concurrently as illustrated in FIG. 9B may sequentially or concurrently use information from the same read operation to test multiple hypotheses or assumptions when attempting to decode the data. Each of the multiple hypotheses tested operates on the same read information and a decoding process that differs from other decoding processes in at least one characteristic. Multiple hypotheses testing is illustrated in FIG. 10, which illustrates, as an example, the first decoding process 921 of FIG. 9B. It will be appreciated that the decoder circuitry 910 of FIG. 9A, the second decoding process 922 of FIG. 9B, and/or the Nth decoding process 923 of FIG. 9B may also sequentially or concurrently test multiple hypotheses.

As illustrated in FIG. 10, the first decoding process 921 implements multiple decoding processes 1010, 1020, 1030, each of the multiple decoding processes 1010, 1020, 1030 decoding the information from the initial read operation and testing a different hypothesis. For example, each of the hypotheses A-M tested respectively by decoding processes A-M may assume different signal/noise statistical characteristics. Thus, M different hypotheses are applied to the same source data. Depending on the hardware and/or software architecture of the decoder, the M decoding processes may be implemented sequentially or concurrently. In one implementation, the M hypotheses may be tested sequentially, starting from the most likely hypothesis to achieve convergence and ending with the least likely hypothesis to achieve convergence. In another implementation, each of the decoding processes A-M 1010, 1020, 1030 may operate concurrently to concurrently test hypotheses A-M. This implementation is particularly useful for flash technology wherein a single memory controller controls multiple memory device chips and therefore includes duplicate detector/decoder hardware. In yet another implementation, testing the hypotheses may be a hybrid of sequential and concurrent operation, wherein more than one but less than M hypotheses are tested simultaneously.

In some configurations, the output of one decoding process 1010, 1020, 1030 may be used to control one or more other decoding processes 1010, 1020, 1030. For example for either sequential or concurrent operation, an output of a first in time decoding process 1010, 1020, 1030 to achieve convergence may be used to disable other decoding processes 1010, 1020, 1030. As another example, for sequential operation, a failure to achieve convergence of a decoding process 1010, 1020, 1030 may trigger the implementation of one or more of the other decoding processes 1010, 1020, 1030.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method of decoding data stored in memory cells of a memory device, comprising:
receiving information from a nominal reference read operation of the memory cells indicative of data stored in the memory cells, the nominal reference read operation comparing analog voltages of the memory cells to at least one nominal reference voltage;
receiving information from a shifted reference read operation of the memory cells indicative of the data stored in the memory cells, the shifted reference read operation comparing the analog voltages of the memory cells to at least one shifted reference voltage that is shifted from the nominal reference voltage to compensate for an expected change in the analog voltages of the memory cells;
decoding the data stored in the memory cells by a first decoding process that uses the information from either the nominal reference read operation or the shifted reference read operation;
decoding the data stored in the memory cells by a second decoding process that uses the information from both of the nominal reference read operation and the shifted reference read operation; and
generating an output of the data decoded by one or both of the first decoding process and the second decoding process.

2. The method of claim 1, wherein the nominal reference read information is used to determine soft information for the second decoding process.

3. The method of claim 1, wherein the shifted reference read information is used to determine soft information for the second decoding process.

4. The method of claim 1, wherein one or both of the first and second decoding processes comprises a low density parity check (LDPC) decoding process.

5. The method of claim 1, wherein the shifted reference voltage is shifted from the nominal reference voltage in a direction that compensates for the expected change in the analog voltages of the memory cells due to charge leakage.

6. The method of claim 1, wherein the shifted reference voltage is shifted from the nominal reference voltage in a direction that compensates for the expected change in the analog voltages of the memory cells due to one or more of program disturb, read disturb and erase disturb.

7. The method of claim 1, wherein the shifted reference voltage is shifted from the nominal reference voltage according to a function of retention time of the data stored in the memory cells.

8. The method of claim 1, wherein the shifted reference voltage is shifted from the nominal reference voltage based on a model of the charge loss of the memory cells.

9. The method of claim 1, wherein one of the first and second decoding processes performs hard decision decoding and another of the first and second decoding processes performs soft decision decoding.

10. The method of claim 1, wherein the first decoding process performs hard decision decoding and the second decoding process performs soft decision decoding.

11. The method of claim 1, wherein either the nominal reference read operation or the shifted reference read operation is requested in response to the first decoding process failing to achieve convergence.

12. The method of claim 1, wherein the second decoding process is terminated in response to the first decoding process achieving convergence.

13. The method of claim 1, wherein:
the nominal reference read operation is performed before the shifted reference read operation and the information from the nominal reference read operation is used in the first decoding process; and
the first decoding process performs hard decision decoding.

14. The method of claim 1, wherein:
the shifted reference read operation is performed before the nominal reference read operation and the information from the shifted reference read operation is used in the first decoding process; and
the first decoding process performs hard decision decoding.

15. A memory device, comprising:
input circuitry configured to receive information from a nominal reference read operation of memory cells, the nominal reference read operation comparing analog voltages of the memory cells to at least one nominal reference voltage, the input circuitry further configured to receive information from a shifted reference read operation of the memory cells, the shifted reference read operation comparing the analog voltages of the memory cells to at least one shifted reference voltage that is shifted from the nominal reference voltage to compensate for an expected change in the analog voltages of the memory cells; and
decoder circuitry configured to decode the data stored in the memory cells, the decoder circuitry configured to implement a first decoding process that operates on either the information obtained from the nominal reference read operation or the information obtained from the shifted reference read operation, the decoder circuitry further configured to implement a second decoding process that operates on both the information obtained from the nominal reference read operation and the information obtained from the shifted reference read operation.

16. The memory device of claim 15, wherein the memory cells are multi level memory cells and the nominal reference voltage comprises a set of nominal reference voltages corresponding to multiple levels of the memory cells and the shifted reference voltage comprises a set of shifted reference voltages corresponding to the multiple levels of the memory cells.

17. The memory device of claim 15, wherein the shifted reference voltage compensates for the expected change in the analog voltages of the memory cells due to one or both of charge leakage and disturb effects.

18. The memory device of claim 15, further comprising control circuitry configured to generate a request signal indicating a request for the nominal reference read operation or the shifted reference read operation.

19. The memory device of claim 18, wherein:
the first decoding process involves hard decision decoding; and
the control circuitry is configured to generate the request signal if the hard decision decoding process does not achieve convergence.

20. The memory device of claim 15, further comprising reference voltage control circuitry configured to determine the shifted reference voltage.

* * * * *